US012658248B2

(12) United States Patent
Kim et al.

(10) Patent No.: US 12,658,248 B2
(45) Date of Patent: Jun. 16, 2026

(54) EMBEDDED MEMORY DEVICE INCLUDING CROPPED BITLINE STRUCTURE AND OPERATING METHOD THEREOF

(71) Applicant: Samsung Electronics Co., Ltd., Suwon-si (KR)

(72) Inventors: Hyunjun Kim, Suwon-si (KR); Kyeongrim Baek, Seoul (KR); Seongook Jung, Seoul (KR); Sekeon Kim, Seoul (KR); Keonhee Cho, Seoul (KR)

(73) Assignees: SAMSUNG ELECTRONICS CO., LTD., Suwon-si (KR); UIF (University Industry Foundation), Yonsei University, Seoul (KR)

( * ) Notice: Subject to any disclaimer, the term of this patent is extended or adjusted under 35 U.S.C. 154(b) by 214 days.

(21) Appl. No.: 18/539,411

(22) Filed: Dec. 14, 2023

(65) Prior Publication Data
US 2024/0386946 A1     Nov. 21, 2024

(30) Foreign Application Priority Data

May 16, 2023    (KR) ........................ 10-2023-0063050
Aug. 16, 2023    (KR) ........................ 10-2023-0106654

(51) Int. Cl.
*G11C 11/418*        (2006.01)
*G11C 5/06*          (2006.01)
*G11C 11/419*        (2006.01)

(52) U.S. Cl.
CPC ............ *G11C 11/418* (2013.01); *G11C 5/063* (2013.01); *G11C 11/419* (2013.01)

(58) Field of Classification Search
CPC ...... G11C 11/418; G11C 11/419; G11C 5/063
USPC ...................................................... 365/185.13
See application file for complete search history.

(56) References Cited

U.S. PATENT DOCUMENTS

| | | | |
|---|---|---|---|
| 7,376,027 B1 * | 5/2008 | Chung | G11C 11/4097 |
| | | | 365/189.08 |
| 11,012,246 B2 | 5/2021 | Lu et al. | |
| 11,295,791 B2 | 4/2022 | Katoch et al. | |
| 12,020,766 B2 * | 6/2024 | Raj | G11C 7/106 |
| 2004/0057279 A1 * | 3/2004 | Clark | G11C 7/1096 |
| | | | 711/E12.041 |
| 2008/0298111 A1 | 12/2008 | Ahn et al. | |

(Continued)

FOREIGN PATENT DOCUMENTS

| | | |
|---|---|---|
| KR | 10-0895512 B1 | 4/2009 |
| KR | 10-2017-0078551 A | 7/2017 |
| KR | 10-2021-0086933 A | 7/2021 |

*Primary Examiner* — Sung Il Cho
(74) *Attorney, Agent, or Firm* — Muir Patent Law, PLLC

(57) ABSTRACT

An embedded memory device includes a plurality of first bit cells configured to store data and connected between a first bitline and a first complementary bitline, and at least one first cropping cell connected between the first bitline and the first complementary bitline. The at least one first cropping cell electrically connects a global bitline to the first bitline and electrically connects a complementary global bitline to the first complementary bitline in response to a first crop wordline signal. The global bitline and the complementary global bitline are implemented as an upper metal member, and the first bitline and the first complementary bitline are implemented as a lower metal member disposed below the upper metal member.

20 Claims, 20 Drawing Sheets

(56) References Cited

U.S. PATENT DOCUMENTS

| | | |
|---|---|---|
| 2014/0126314 A1 | 5/2014 | Anvar et al. |
| 2014/0225201 A1* | 8/2014 | Paul et al. |
| 2019/0244656 A1* | 8/2019 | Li ...................... G11C 11/4097 |
| 2019/0273084 A1* | 9/2019 | Wang .................... G11C 11/412 |
| 2020/0020391 A1 | 1/2020 | Singh et al. |
| 2021/0005232 A1 | 1/2021 | Katoch et al. |
| 2022/0215867 A1 | 7/2022 | Yang et al. |

* cited by examiner

111

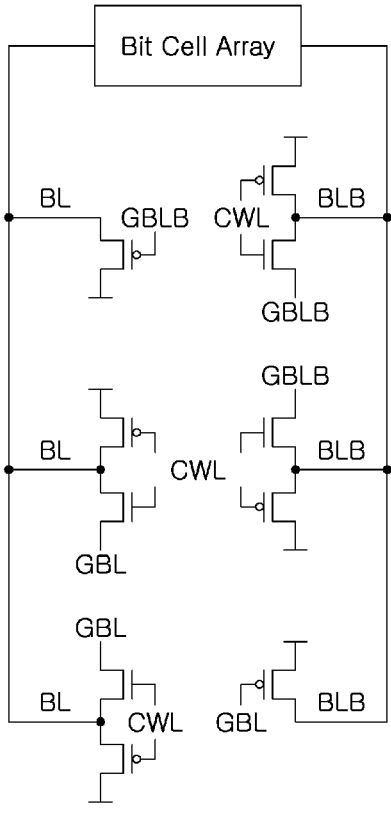
FIG, 6

312-1

312-2

312-3

EDGE

| | |
|---|---|
| Cropping Cell B [custom] | Cropping Cell B [custom] |
| P080_ver3 [modified] | P080_ver3 [modified] |
| P080_ver3 [modified] | P080_ver3 [modified] |
| P080_ver3 [modified] | P080_ver3 [modified] |
| Cropping Cell A [custom] | Cropping Cell A [custom] |
| Cropping Cell B [custom] | Cropping Cell B [custom] |
| P080_ver3 [modified] | P080_ver3 [modified] |
| P080_ver3 [modified] | P080_ver3 [modified] |
| P080_ver3 [modified] | P080_ver3 [modified] |
| Cropping Cell A [custom] | Cropping Cell A [custom] |

EDGE

EDGE

EDGE

EMBEDDED MEMORY DEVICE INCLUDING CROPPED BITLINE STRUCTURE AND OPERATING METHOD THEREOF

CROSS-REFERENCE TO RELATED APPLICATION(S)

This application claims benefit of priority to Korean Patent Application Nos. 10-2023-0063050 filed on May 16, 2023 and 10-2023-0106654 filed on Aug. 16, 2023 in the Korean Intellectual Property Office, the disclosure of each of which is incorporated herein by reference in its entirety.

BACKGROUND

The present inventive concept relates to an embedded memory device and an operating method thereof.

In general, a static random access memory (SRAM) is a type of memory used to temporarily store data in a computer. The word "static" in SRAM means that this memory retains information as long as it is continuously powered. This is in contrast to dynamic random access memory (DRAM), and DRAM has a characteristic that information should be updated (recharged) at regular intervals. Each SRAM cell may include six transistors. This structure makes an SRAM run faster than a DRAM, but an SRAM having the same memory capacity takes up more space (i.e. more transistors) than a DRAM. For this reason, an SRAM is mainly used for applications in which speed is important and capacity is relatively small, such as in cache memory. As the high performance in SRAM increases, a bitline resistance may be important to improve the performance of SRAM. Therefore, in order to realize high performance of the SRAM, reducing the bitline resistance is continuously being conducted.

SUMMARY

An aspect of the present inventive concept is to provide an embedded memory device and an operating method thereof that reduce power consumption while improving write capability.

According to an aspect of the present inventive concept, an embedded memory device includes: a plurality of first bit cells configured to store data and connected between a first bitline and a first complementary bitline; and at least one first cropping cell connected between the first bitline and the first complementary bitline. The at least one first cropping cell electrically connects a global bitline to the first bitline and electrically connects a complementary global bitline to the first complementary bitline in response to a first crop wordline signal. The global bitline and the complementary global bitline are implemented as an upper metal member, and the first bitline and the first complementary bitline are implemented as a lower metal member disposed below the upper metal member.

According to an aspect of the present inventive concept, an embedded memory device includes: a plurality of sub-arrays sharing a plurality of global bitlines and a plurality of complementary global bitlines; and a column peripheral circuit connected to the plurality of global bitlines and the plurality of complementary global bitlines. Each of the plurality of subarrays includes: a plurality of first cropping cells connected to a first crop wordline; a plurality of second cropping cells configured to store data and connected to a second crop wordline; and a plurality of bit cells connected to a plurality of bitlines and complementary bitlines and a plurality of wordlines. In a write operation on bit cells connected to a wordline among the plurality of wordlines, the embedded memory device is configured such that each of the plurality of first cropping cells and the plurality of second cropping cells electrically connects bitlines to global bitlines corresponding to selected bit cells and electrically connects complementary bitlines to complementary global bitlines corresponding to the selected bit cells, The plurality of global bitlines and the complementary global bitlines are implemented as an upper metal member, and the bitline and the complementary bitline are implemented as a lower metal member disposed below the upper metal member.

According to an aspect of the present inventive concept, an operating method of an embedded memory device including a plurality of bit cells connected to a local bitline includes: electrically connecting the local bitline to a global bitline using at least one cropping cell; and performing a write operation on a selected bit cell connected to the local bitline. The global bitline is implemented as an upper metal member, and the local bitline is implemented as a lower metal member disposed below the upper metal member.

According to an aspect of the present inventive concept, an embedded memory device includes: a bit cell array including a plurality of bit cells configured to store data and the plurality of bit cells connected between a bitline and a complementary bitline; and a cropping cell connected between the bitline and the complementary bitline, the cropping cell configured to electrically connect a global bitline to the bitline and electrically connect a complementary global bitline to the complementary bitline in response to a crop wordline signal. The global bitline is implemented as an upper metal member, and the bitline is implemented as a lower metal member disposed below the upper metal member.

BRIEF DESCRIPTION OF DRAWINGS

The above and other aspects, features, and advantages of the present inventive concept will be more clearly understood from the following detailed description, taken in conjunction with the accompanying drawings, in which:

FIG. 6 is a diagram illustrating a cropping cell according to an example embodiment of the present inventive concept;

FIG. 16 is a diagram illustrating a position of a cropping cell according to an example embodiment of the present inventive concept;

DETAILED DESCRIPTION

In the following, the present inventive concept will be described clearly and in detail to the extent that a person skilled in the art may easily practice using the drawings.

In accordance with an embodiment of the present invention, an embedded memory device and an operating method thereof may be implemented to reduce interconnect resistance and capacitance using a cropped bitline structure, aiming for enhanced write capability and dynamic power saving. The embedded memory device and the operating method may mitigate operating resistance by reducing the bitline resistance and capacitance during write operations. Within the embedded memory device of the present invention, a cell-type cropping cell is situated inside a cell array (110 of FIG. 1) of the embedded memory device, allowing for a relatively short bitline, which is cropped from a longer bitline, to be selectively connected to an upper metal component that serves as a global bitline. Hereinafter, it will be understood that when an element is referred to as being "connected" to another element, it may be "electrically connected" and also be "physically connected" to the other element.

By employing the cropping cell added within the cell array, the present invention may connect the cropped bitline to the upper metal component with relatively low resistance and capacitance, thereby reducing the overall resistance and capacitance of the bitline. Consequently, the embedded memory device of the present invention may alleviate the decline in write ability and write speed due to increased interconnect resistance from scaling down. Additionally, the present invention, through a structure inserted and arranged inside the cell array, enables the direct cropping of the bitline and its connection to the upper metal component, resulting in reduced capacitance. Therefore, the embedded memory device of the present invention holds advantages in terms of write speed and power consumption when compared to conventional arts.

Figure 1:
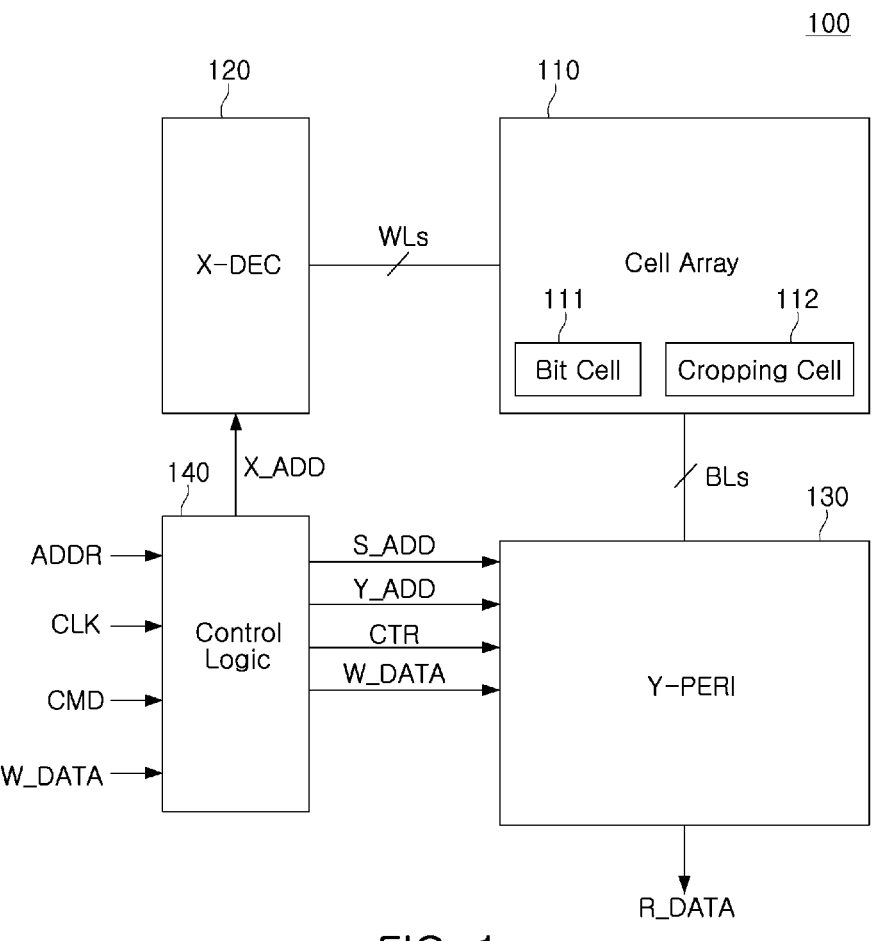
FIG. 1 is a diagram illustrating an embedded memory device according to an example embodiment of the present inventive concept.

FIG. 1 is a diagram illustrating an embedded memory device 100 according to an example embodiment of the present inventive concept. Referring to FIG. 1, an embedded memory device 100 may include a cell array 110, a row decoder (i.e., an X-DEC) 120, a column peripheral circuit (i.e., a Y-PERI) 130, and a control logic 140.

The embedded memory device 100 may receive an address ADDR, a clock CLK, a command CMD, and write data W_DATA. For example, the embedded memory device 100 may receive a command CMD ('write command') instructing write, an address ADDR ('write address') in which write data W_DATA is to be stored, and write data W_DATA and store the write data W_DATA in a target (or selected) region of the cell array 110 corresponding to the write address. In addition, the embedded memory device 100 may receive a command CMD ('read command') indicating read and an address ADDR ('read address') from which read data R_DATA is output, and externally output read data R_DATA from a target region of the cell array 110 corresponding to the read address.

The cell array 110 may include a plurality of bit cells 111 and at least one cropping cell 112.

The plurality of bit cells 111 may be arranged at regular intervals in the cell array 110. The plurality of bit cells 111 may be disposed at points where wordlines and bitlines intersect each other. That is, each of the plurality of bit cells 111 may be connected to at least one of the plurality of wordlines WLs and may be connected to at least one of the plurality of bitlines BLs. Each of the plurality of bit cells 111 may be a memory cell. In an example embodiment, each of the plurality of bit cells 111 may be a volatile memory cell. For example, each of the plurality of bit cells 111 may be a static random access memory (SRAM) cell. For example, each of the plurality of bit cells 111 may be a dual port SRAM (DPSRAM) cell capable of simultaneously performing a write operation and a read operation. In an example embodiment, each of the bit cells 111 may be a non-volatile memory cell, such as a flash memory or a resistive random access memory (RRAM).

At least one cropping cell 112 may be implemented to connect a bitline section corresponding to a target bit cell (or a selected bit cell) to a global bitline during a write operation. In an example embodiment, the cropping cell 112 may be implemented in the form of a bit cell.

In an example embodiment, the cell array 110 may be divided into a plurality of subarrays. A subarray may include a plurality of bit cell arrays and a bit cell array may include a plurality of bit cells. Here, the bit cells 111 may not be arranged at the boundary of the subarrays. The numbers of wordlines WLs and bitlines BLs respectively included in the subarrays may be the same as or different from each other. The embedded memory device 100 may be implemented to perform an access operation on at least one of the subarrays.

The row decoder 120 may be connected to the cell array 110 through a plurality of wordlines WLs. The row decoder 120 may be implemented to activate at least one wordline among the plurality of wordlines WLs based on a row address X_ADD. As the row decoder 120 selects at least one wordline among the plurality of wordlines WLs based on the row address X_ADD, a number of bit cells 111 connected to an activated wordline among a plurality of bit cells 111 may be selected.

The column peripheral circuit 130 may be connected to the cell array 110 through a plurality of bitlines BLs. The column peripheral circuit 130 may be implemented to select at least one bitline from among a plurality of bitlines BLs based on a column address Y_ADD. The column peripheral circuit 130 may select at least one of a plurality of subarrays based on a subarray address S_ADD. The subarray address S_ADD may be an address based on the row address X_ADD. For example, the column peripheral circuit 130 may select a bitline and a complementary bitline included in the subarrays based on the column address Y_ADD and the subarray address S_ADD. Here, the bitline and the complementary bitline may be connected to at least one of the plurality of bit cells 111. As the column peripheral circuit 130 selects the bitline and the complementary bitline, a number of bit cells 111 connected to the bitline and the complementary bitline may be selected.

The column peripheral circuit 130 may perform a read operation or a write operation based on the control signal CTR. The column peripheral circuit 130 may identify values stored in the bit cells 111 connected to the activated wordlines among the plurality of bit cells 111 by detecting the current or voltage received through the plurality of bitlines BLs, and output read data R_DATA based on the identified values.

In addition, the column peripheral circuit 130 may apply current or voltage to the plurality of bitlines BLs based on the write data W_DATA and write values to the bit cells connected to the activated wordlines among the plurality of bit cells 111. According to an example embodiment, the column peripheral circuit 130 may include a read circuit performing a read operation and a write circuit performing a write operation. Also, the column peripheral circuit 130 may include a bitline pre-charge circuit pre-charging a plurality of bitlines BLs. In addition, the column peripheral circuit 130 may include a sense amplifying circuit outputting read data R_DATA by amplifying differences between signals output from the bitlines BLs.

The control logic 140 may be implemented to receive the address ADDR, the clock CLK, the command CMD, and the write data W_DATA and generate the row address X_ADD, the column address Y_ADD, the subarray address S_ADD, and the control signal CTR. For example, the control logic 140 may identify a read command by decoding the command CMD and may generate the row address X_ADD, the column address Y_ADD, the subarray address S_ADD, and the control signal CTR to read the read data R_DATA. Also, the control logic 140 may identify a write command by decoding the command CMD and may generate the row address X_ADD, the column address Y_ADD, the subarray address S_ADD, and the control signal CTR to write data W_DATA to the cell array 110.

Hereinbelow, it is described that the embedded memory device 100 of the present inventive concept is implemented as SRAM. In general, SRAM has a relatively high speed among various memories and is used as L1, L2, and L3 caches inside a system-on-chip (SoC). Recently, the capacity of a cache required by a central processing unit (CPU) has increased. In particular, in applications that require fast data processing and long battery life, such as mobile devices, SRAM has become an important factor in determining overall SoC performance. Meanwhile, as a size of the SRAM bit=cell decreases, a thickness of the interconnect metal passing over the bit cell having a limited size also decreases. However, when the size of the bit cell of the SRAM is below a certain level, resistance of a bitline interconnect increases rapidly. In SRAM, a total length of the bitline has increased due to an increase in required capacity along with a reduced thickness of a bitline metal. Because of this, there is a possibility of an even more rapid increase in bitline resistance. Such rapid increase in the bitline resistance may prevent write data from being easily transmitted, thereby causing a degradation of write performance.

In contrast, the embedded memory device 100 according to an example embodiment of the present inventive concept may reduce interconnect/bitline resistance by connecting a relatively short bitline section to a global bitline through the cropping cell 112 during a write operation. Thus, the embedded memory device 100 according to the present inventive concept may improve write performance and reduce power consumption at the same time.

Figure 2:
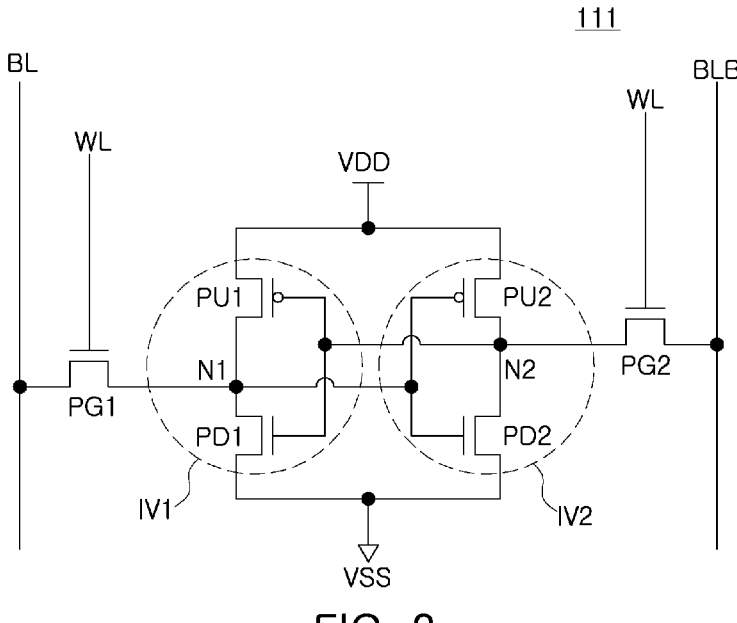
FIG. 2 is a diagram illustrating a bit cell illustrated in FIG. 1.

FIG. 2 is a diagram illustrating the bit cell 111 illustrated in FIG. 1. Referring to FIG. 2, the bit cell 111 includes a first pass transistor PG1, a second pass transistor PG2, a first pull-up transistor PU1, a second pull-up transistor PU2, a first pull-down transistor PD1, and a second pull-down transistor PD2.

In an example embodiment, the first and second pass transistors PG1 and PG2 and the first and second pull-down transistors PD1 and PD2 may be N-type transistors, and the first and second pull-up transistors PU1 and PU2 may be P-type transistors.

In an example embodiment, the first and second pass transistors PG1 and PG2 and the first and second pull-down transistors PD1 and PD2 may be N-channel metal oxide semiconductor field effect transistors (NMOS-FETs), and the first and second pull-up transistors PU1 and PU2 may be P-channel MOSFETs (PMOS-FETs).

In an example embodiment, the first pull-up transistor PU1 and the first pull-down transistor PD1 may constitute a first inverter IV1, and the second pull-up transistor PU2 and the second pull-down transistor PD2 may constitute a second inverter IV2. Specifically, a drain terminal of the first pull-up transistor PU1 may be connected to a drain terminal of the first pull-down transistor PD1, and a gate of the first pull-up transistor PU1 may be electrically connected to a gate of the first pull-down transistor PD1. A power supply voltage VDD may be applied to a source terminal of the first pull-up transistor PU1, and a ground voltage VSS may be applied to a source terminal of the first pull-down transistor PD1. Accordingly, the first pull-up and first pull-down transistors PU1 and PD1 may constitute the first inverter IV1.

Similarly, a drain terminal of the second pull-up transistor PU2 may be connected to a drain terminal of the second pull-down transistor PD2, and a gate of the second pull-up transistor PU2 may be electrically connected to a gate of the second pull-down transistor PD2. The power supply voltage VDD may be applied to a source terminal of the second pull-up transistor PU2, and the ground voltage VSS may be applied to a source terminal of the second pull-down transistor PD2. Accordingly, the second pull-up and second pull-down transistors PU2 and PD2 may constitute the second inverter IV2. The gate of the first pull-up transistor PU1 and the gate of the first pull-down transistor PD1 connected to each other may correspond to an input terminal of the first inverter IV1, and a first node N1 connected to the drain terminal of the first pull-up transistor PU1 and the drain terminal of the first pull-down transistor PD1 may correspond to an output terminal of the first inverter IV1. The gate of the second pull-up transistor PU2 and the gate of the second pull-down transistor PD2 connected to each other may correspond to an input terminal of the second inverter IV2, and a second node N2 connected to the drain terminal of the second pull-up transistor PU2 and the drain terminal of the second pull-down transistor PD2 may correspond to an output terminal of the second inverter IV2.

In an example embodiment, the first inverter IV1 and the second inverter IV2 may be coupled in a latch structure. That is, the gate of the first pull-up transistor PU1 and the gate of the first pull-down transistor PD1 may be connected to the second node N2, and the gate of the second pull-up transistor PU2 and the gate of the first pull-down transistor PD2 may be connected to the first node N1. One end of the first pass transistor PG1 may be connected to the first node N1 and the other end of the first pass transistor PG1 may be connected to a bitline BL. One end of the second pass transistor PG2 may be connected to the second node N2 and the other end of the second pass transistor PG2 may be connected to a complementary bitline BLB. A gate of the first pass transistor PG1 and a gate of the second pass transistor PG2 may be connected to a wordline WL.

The bit cell 111 may write logic data through the first node N1 and the second node N2 or read logic data through the first node N1 and the second node N2, using the wordline WL, the bitline BL, and the complementary bitline BLB.

Figure 3:
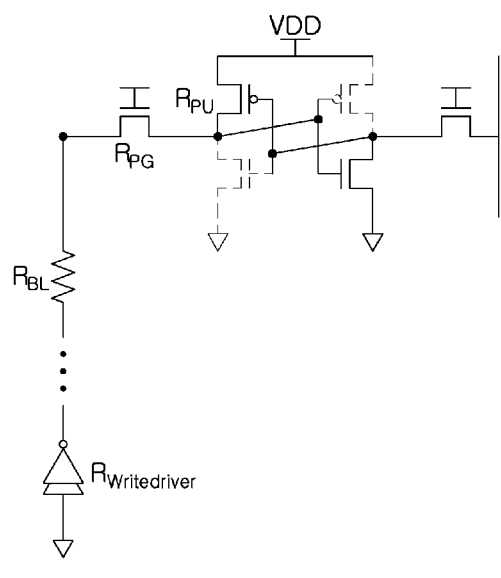
FIG. 3 is a diagram illustrating an effect of bitline resistance on write capability.

FIG. 3 is a diagram illustrating an effect of bitline resistance on write capability.

Resistance affecting a write path of SRAM include resistance $R_{Write\_driver}$ of a write driver, resistance $R_{BL}$ of a bitline BL, and transistor resistance $R_{cell\_TR}$ (e.g., resistance $R_{PG}$ of the first pass transistor PG1+resistance $R_{PU}$ of the first pull-up transistor PU1) inside the bit cell. Voltage affecting a write operation of SRAM is a voltage saturated in the BL $V_{BL\_sat}$ to the bit cell and may be expressed by Equation 1 below.

$$V_{BL\_set} = \frac{R_{BL} + R_{Write\_driver}}{R_{cell\_TR} + R_{BL} + R_{Write\_driver}} V_{DD} \qquad \text{[Equation 1]}$$

$$= \frac{R_{BL}/R_{cell\_TR}}{1 + \frac{R_{BL}}{R_{cell\_TR}}} V_{DD}$$

In the above Equation 1, the resistance $R_{Write\_driver}$ of the write driver is very small so it may be ignored, and a final Equation 1 may be expressed by a voltage divider formula of the resistance $R_{BL}$ of the bitline BL and the transistor resistance $R_{cell\_TR}$ of the bit cell. Referring to Equation 1, as the resistance $R_{BL}$ of the bitline BL increases, the BL saturation voltage does not become completely zero and is gradually saturated to a higher voltage. Therefore, the increase in the resistance $R_{BL}$ of the bitline BL causes a decrease in write performance.

In general, the resistance of the bitline BL is reduced by changing a back end of line (BEOL) structure. The BEOL structure is basically a structure using an upper metal member having relatively low resistance and capacitance. Generally, the upper metal member has resistance smaller than a lower metal member. In this case, routing may be performed using a relatively wide space, and thus, a relatively wide metal line may be disposed. In addition, materials of the metal constituting the circuit are different for each layer, and a material having relatively low specific resistance is used for the upper metal member. The reason why the upper metal member has less capacitance than the lower metal member is because no additional transistor is connected to the line.

Flying BL (FBL) divides the lower metal member BL with high resistance into two pieces using a strep cell and connects the lower metal member BL that is far from the write driver to the upper metal member BL to connect to the bottom of the array to reduce resistance. In a dual BL (DBL), the upper metal member BL having small resistance is connected in parallel to the entire lower metal member BL having large resistance through separate switches installed above and below the array only when a write operation is performed, thereby significantly reducing overall resistance. However, the FBL has a limitation in reducing resistance because the entire array may be divided only in half, and has a disadvantage in that the effect rapidly decreases in a situation where the resistance increases significantly. In addition, the DBL is very efficient in terms of reducing resistance, but in terms of capacitance, since the upper metal member BL, an additional load, is added to the lower metal member BL used previously, the problems of power and speed degradation arise due to the increase in capacitance.

The embedded memory device 100 according to an example embodiment of the present inventive concept may effectively reduce both resistance and capacitance of the bitline BL compared to the conventional structure by connecting a local bitline LBL to the upper metal member using the cropping cell during a write operation.

Figure 4:
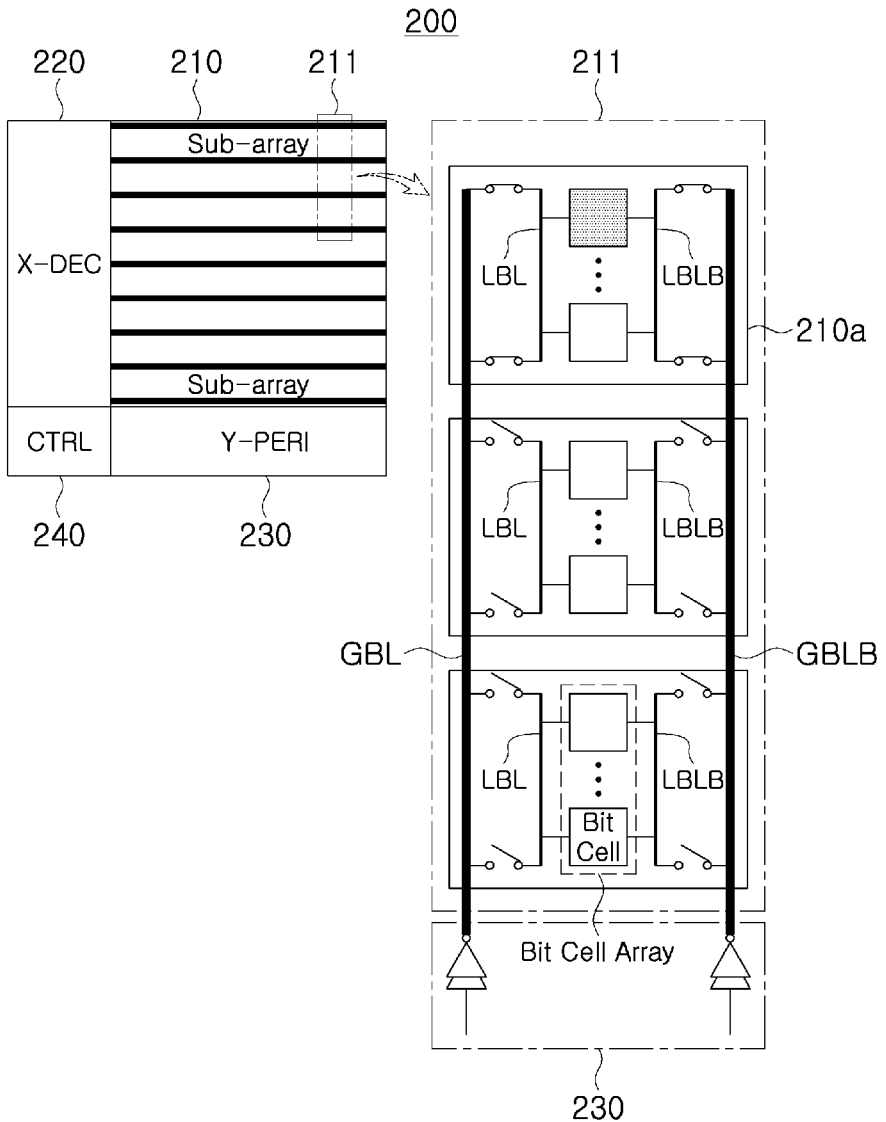
FIG. 4 is a diagram illustrating a crop bitline structure of an embedded memory device according to an example embodiment of the present inventive concept.

FIG. 4 is a diagram illustrating a crop bitline (CBL) structure 211 of an embedded memory device 200 according to an example embodiment of the present inventive concept. Referring to FIG. 4, the embedded memory device 200 may include a cell array 210, a row decoder (or an X-DEC) 220, a column peripheral circuit (or a Y-PERI) 230, and a control logic 240 (CTRL). The cell array 210 may include a plurality of subarrays 210a to 210n (n is a natural number greater than 1). The crop bitline structure 211 may be included in the cell array 210.

As illustrated in FIG. 4, the crop bitline structure 211 is a structure in which a lower metal member BL (or local bitline LBL or a complementary local bitline LBLB) that has been previously connected long is cut to a desired length and selectively connected to an upper metal member BL (or a global bitline GBL or a complementary global bitline GBLB) that is long connected to the cut local bitline LBL/LBLB according to a position of a target cell to be accessed. The local bitline LBL/LBLB may receive write data or output read data through the global bitline GBL/GBLB. Herein, for convenience of description, the terms of the local bitline LBL/LBLB and the local bitline LBL and the complementary local bitline LBLB may be used interchangeably, and the terms of the global bitline GBL/GBLB and the global bitline GBL and the complementary global bitline GBLB may be used interchangeably.

In the embedded memory device 200, the selected local bitline LBL/LBLB during a write operation is connected in parallel to the global bitline GBL/GBLB through switches (e.g., NMOS transistor switches) located above and below the local bitline LBL/LBLB, thereby efficiently reducing bitline resistance.

In the embedded memory device 200 according to an example embodiment of the present inventive concept, a bitline is classified into a plurality of local bitlines and a target bit cell may be accessed selectively through the global bitline GBL having a small capacitance and resistance. For example, a plurality of bit cells in a local bitline The embedded memory device 200 according to an example embodiment of the present inventive concept may reduce bitline resistance and capacitance by using the upper metal member during a write operation. The embedded memory device 200 according to an example embodiment of the present inventive concept may use a cropping cell for cutting a bitline in the cell array 210. Here, the size of the cropping cell may be scaled up or down according to a design goal. Since the embedded memory device 200 of the present inventive concept is implemented with a crop bitline structure, write capability yield may be improved, a write operation speed may be improved, and write power may be dynamically reduced.

Figure 5:
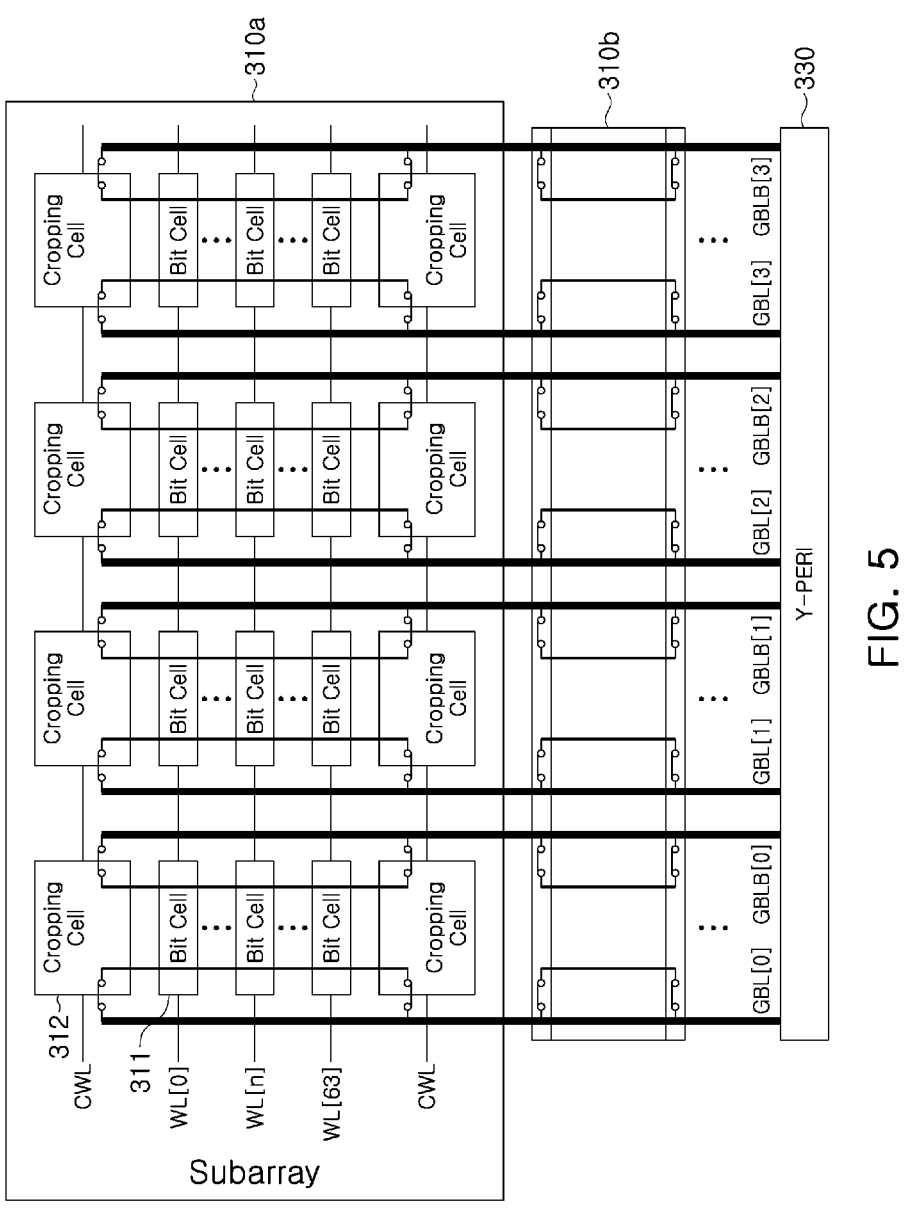
FIG. 5 is a diagram illustrating a subarray of an embedded memory device according to an example embodiment of the present inventive concept.

FIG. 5 is a diagram illustrating a subarray 310 of an embedded memory device according to an example embodiment of the present inventive concept. Referring to FIG. 5, the embedded memory device may include the subarray 310 having a plurality of subarrays 310a and 310b, and a column peripheral circuit (or a Y-PERI) 330. The subarray 310a may include bit cells 311 connected between each of the word-lines WL[0] to WL[63] and the local bitline LBL/LBLB and a plurality of cropping cells 312 connected between the crop wordline CWL and the local bitline LBL/LBLB. Here, the local bitline LBL/LBLB may be connected to corresponding global bitlines GBL[0] to GBL[3]/GBLB[0] to GBLB[3] through the cropping cell 312. Herein, for convenience of description, the terms of the crop wordline CWL and a crop wordline signal CWL may be used interchangeably.

FIG. 6 is a diagram illustrating a cropping cell 312 according to an example embodiment of the present inventive concept. Referring to FIG. 6, the cropping cell 312 may be implemented as a structure inserted at an upper end and a lower end of a bit cell array in each of the subarrays 310a and 310b. The cropping cell 312 includes circuits that play the following three roles: the first is an NMOS MUX connecting the global bitline GBL/GBLB to the local bitline LBL/LBLB when the crop wordline CWL is at a high-level (e.g., 1), the second is a local pre-charger pre-charging the local bitline LBL/LBLB when the crop wordline CWL has a low-level (e.g., 0), and the third is a cross-coupled PMOS transistor stably maintaining a voltage of the local bitline LBL/LBLB upon receiving global bitline GBL/GBLB data.

Figure 7A:
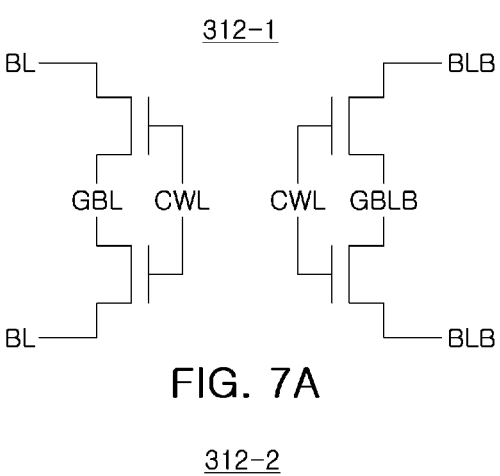
FIGS. 7A, 7B, and 7C are diagrams illustrating functions of a cropping cell.
Figure 7B:
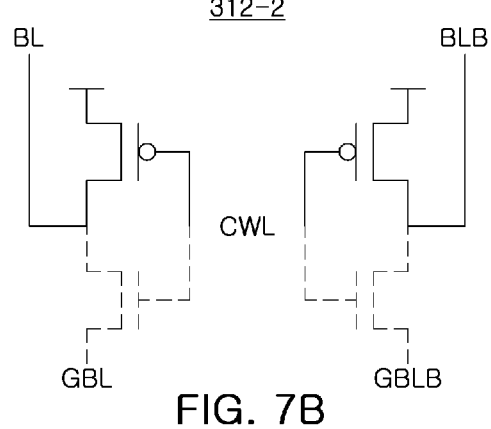
Figure 7C:
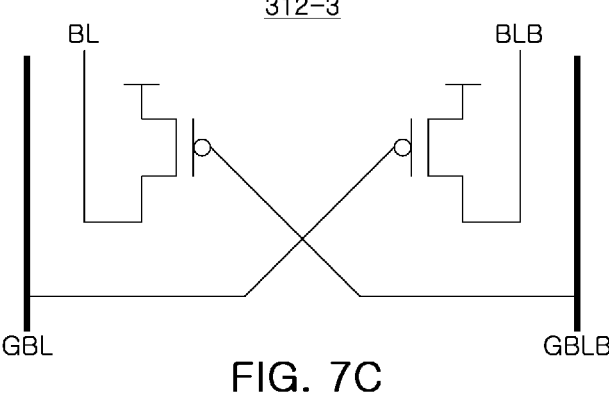

FIGS. 7A, 7B, and 7C are diagrams illustrating functions of a cropping cell. As illustrated in FIG. 7A, when the crop wordline CWL is at a high-level, the bitline BL/BLB and the global bitline GBL/GBLB may be electrically connected to each other. Herein, for convenience of description, the terms of the bitline BL/BLB and the bitline BL and the comple-mentary bitline BLB may be used interchangeably. When the crop wordline CWL is 1, two NMOS switches 312-1 may be used for BL/BLB for a smooth connection to the NMOS switch for connecting the local bitline BL/BLB to the global bitline GBL/GBLB. As illustrated in FIG. 7B, a pre-charger 312-2 may pre-charge the bitline BL/BLB when the crop wordline CWL becomes 0, for example, when the corresponding local bitline BL/BLB is not accessed. As illustrated in FIG. 7C, when a write operation is performed, the bitline BL/BLB is driven through the NMOS switch in terms of the characteristics of the structure. Because of this, a local cross-coupled PMOS switch 312-3 may supplement driving to stably maintain the bitline BL/BLB at '1'.

Figure 8A:
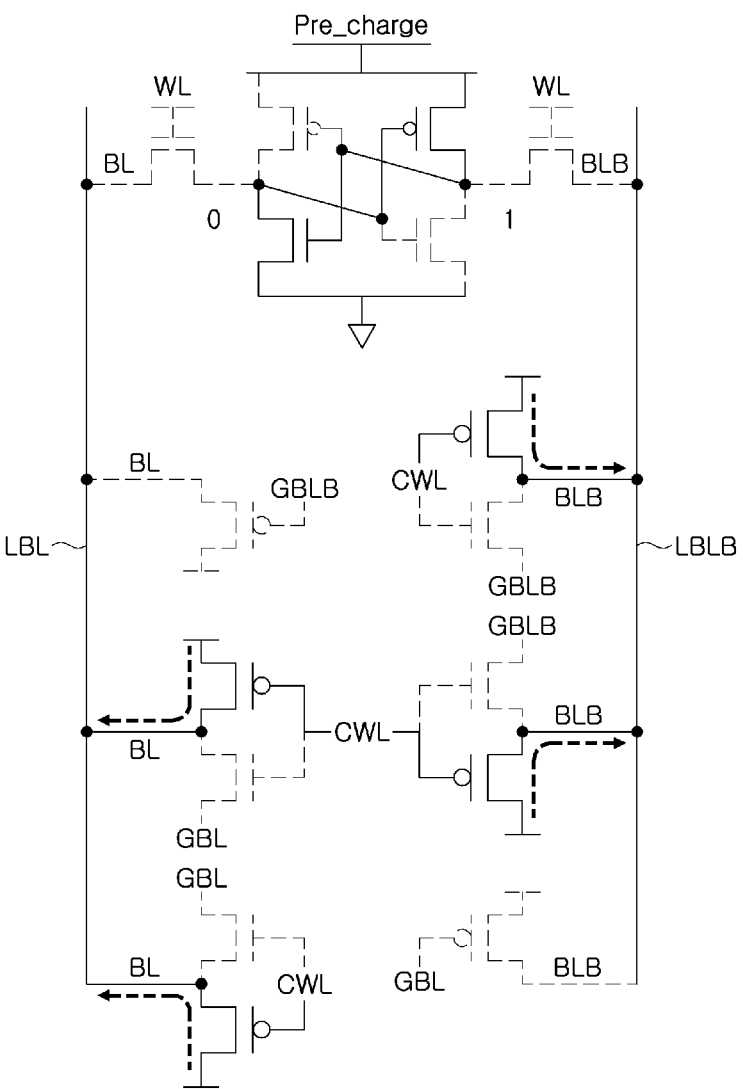
FIGS. 8A, 8B, and 8C are diagrams illustrating an operation of a cropping cell according to an operation of a bit cell.
Figure 8B:
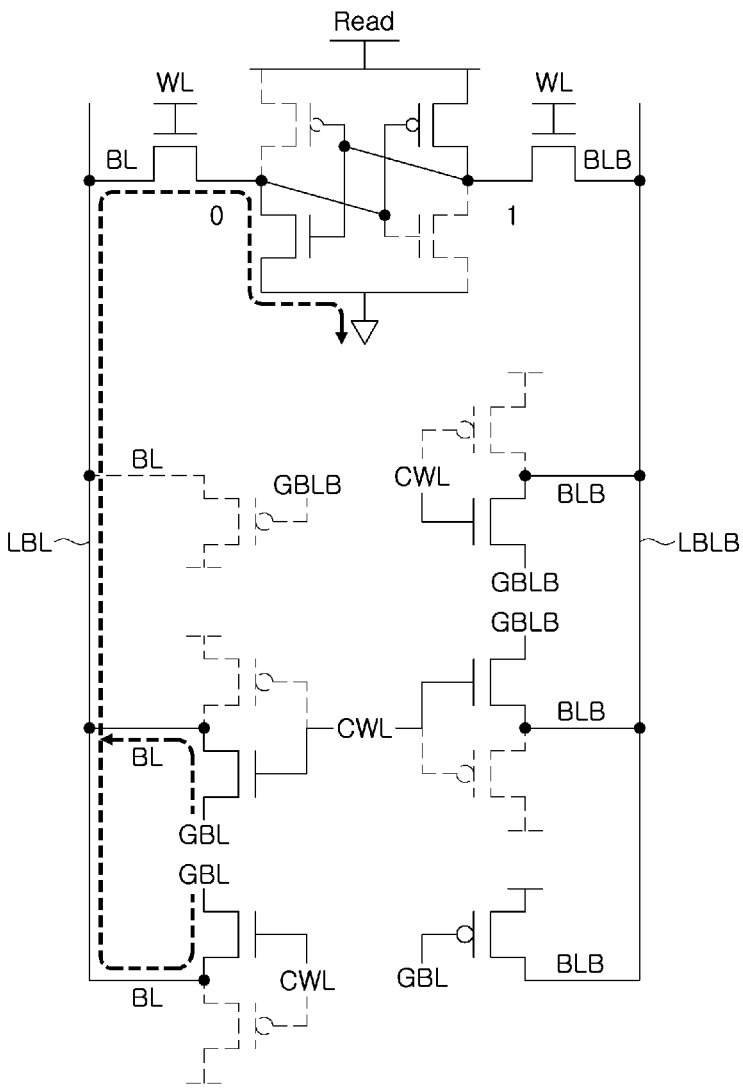
Figure 8C:
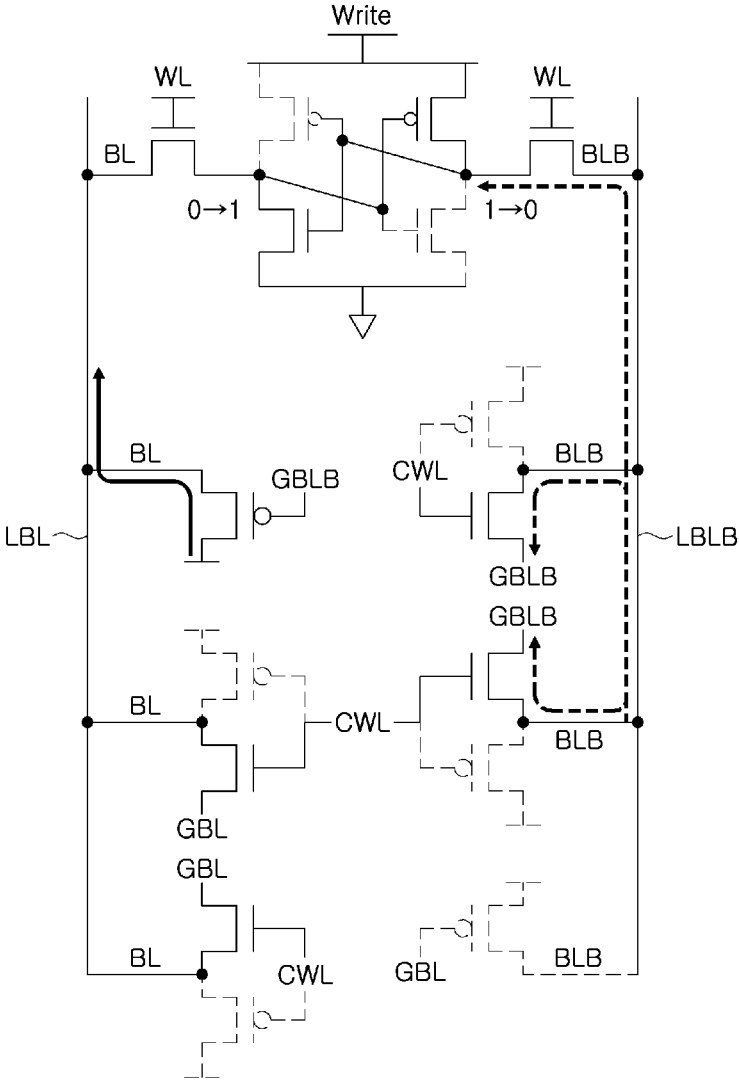

FIGS. 8A, 8B, and 8C are diagrams illustrating an opera-tion of a cropping cell according to an operation of a bit cell. Since the cropping cell has the same poly, fin pitch, or pattern as a portion of the bit cell array and the same metal routing pattern as a portion of adjacent bit cells among the bit cells in the bit cell array, it may be inserted into the subarray without white (or empty) space.

Referring to FIG. 8A, a pre-charge operation of a crop-ping cell is illustrated. When a crop wordline CWL is '0', the bitline BL/BLB may be pre-charged through a local pre-charger. Referring to FIG. 8B, a read operation of a cropping cell is illustrated. A target bit cell may be discharged through the local bitline BL to which the charge of the global bitline GBL is connected. Since it passes through the NMOS MUX once more, a discharge speed is slightly slow in the begin-ning. However, since an RC of the bitline BL itself is small, it is faster than a conventional structure. Referring to FIG. 8C, a write operation of a cropping cell is illustrated. The complementary bitline BLB is discharged to the ground voltage VSS. The small RC of the bitline BL is advantageous in terms of write capability and speed. In the case of a bitline BL that needs to remain high ('1'), the cross-coupled PMOS switch helps maintain a stable state.

Figure 9A:
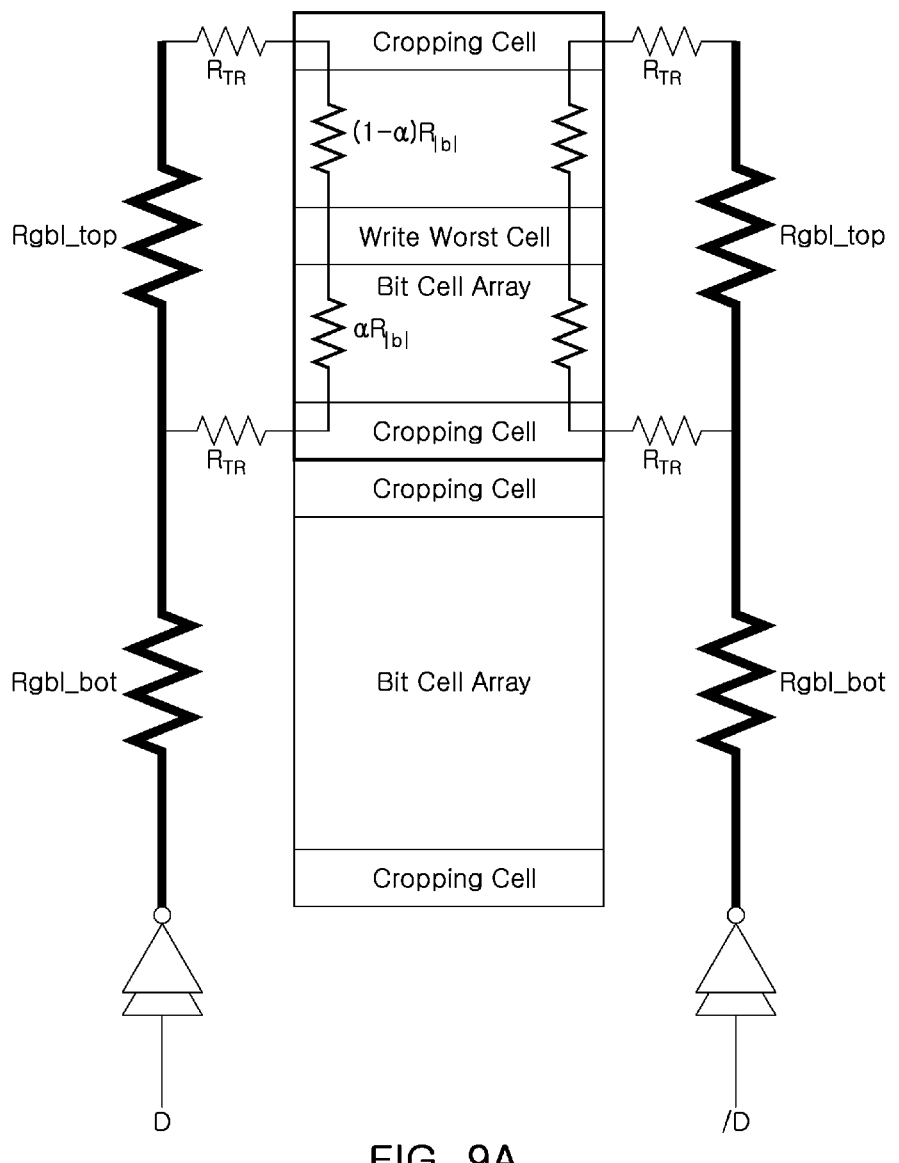
FIGS. 9A and 9B are diagrams illustrating resistances of elements constituting a bitline in order to analyze efficiency in a CBL structure according to an example embodiment of the present inventive concept.
Figure 9B:
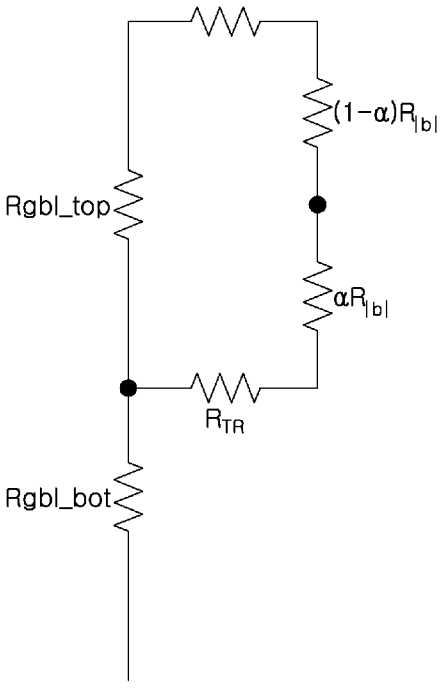

FIGS. 9A and 9B are diagrams illustrating resistances of elements constituting a bitline in order to analyze efficiency in a CBL structure according to an example embodiment of the present inventive concept. As illustrated in FIG. 9A, resistances are largely divided into a global bitline resistance ($R_{gbl\_top}$, $R_{gbl\_bot}$), a local bitline resistance ($\alpha R_{lbl}$, $(1-\alpha)$ $R_{lbl}$), and a transistor resistance connecting a global bitline and a local bitline. As illustrated in FIG. 9B, a BL effective resistance for a specific position may be expressed by Equation 2 below.

$$EffectiveR = \qquad\qquad\qquad\qquad\qquad\qquad [\text{Equation 2}]$$
$$R_{gbl\_bot} + \left[ (R_{gbl\_top} + R_{TR} + (1-\alpha)R_{lbl})//(R_{TR} + \alpha R_{lbl}) \right]$$

The CBL structure of the present inventive concept has different effective resistances depending on the height at which bit cells are located in a bit cell array. A variable called $\alpha$ is introduced to express the effective resistance. If $\alpha$ is 0 inside a bit cell array, it refers to a bit cell at the bottom (closest to a write driver), and if $\alpha$ is 1, it refers to a bit cell at the top (farthest from the write driver).

Figure 10A:
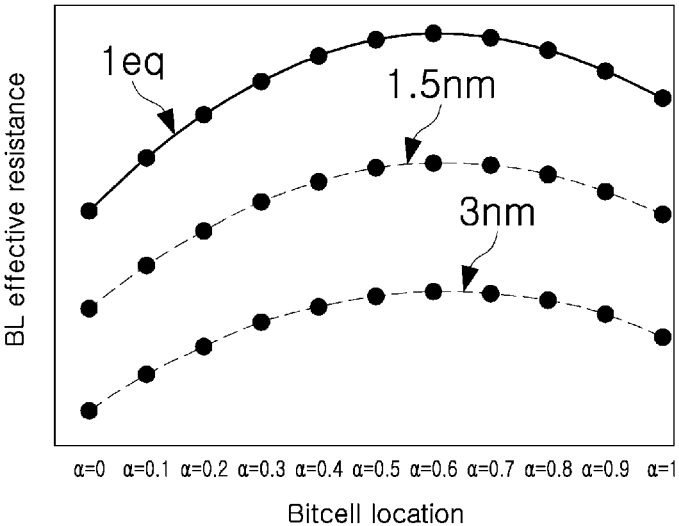
FIGS. 10A and 10B are diagrams illustrating a change in BL effective resistance and an effect of a CBL structure according to a position of a bit cell.
Figure 10B:
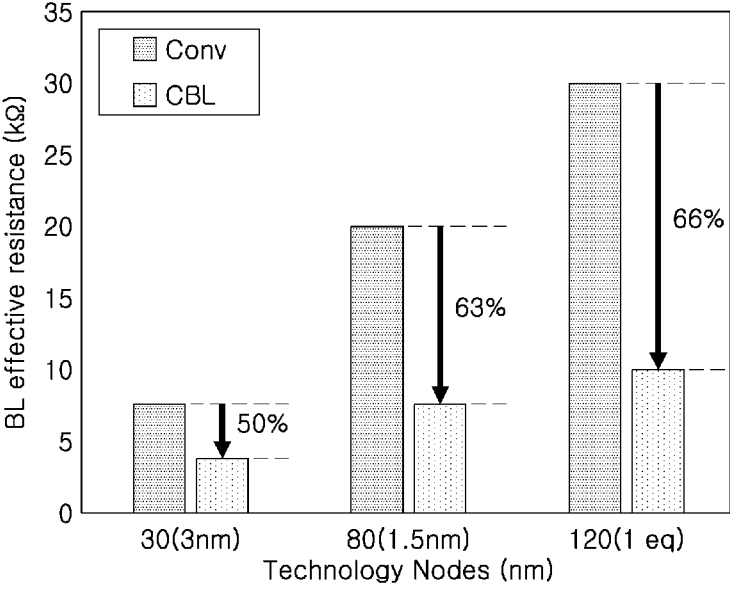

FIGS. 10A and 10B are diagrams illustrating a change in BL effective resistance and an effect of a CBL structure according to a position of a bit cell. Referring to FIG. 10A, a change in the BL effective resistance inside a bit cell array according to $\alpha$ is illustrated. Referring to FIG. 10B, for comparison between the conventional art and the CBL structure, resistance of a bitline is a numerical value for modeling each technology node. For convenience, a resis-tance $R_{gbl}$ of a global bitline is limited to ¼ of the value of the local bitline $BL_{lbl}$. As illustrated in FIG. 10B, as a result of comparing the bitline effective resistances of the conven-tional art structure and the CBL structure of the present inventive concept at each technology node, a resistance reduction of 50% to 66% is confirmed.

Figure 11:
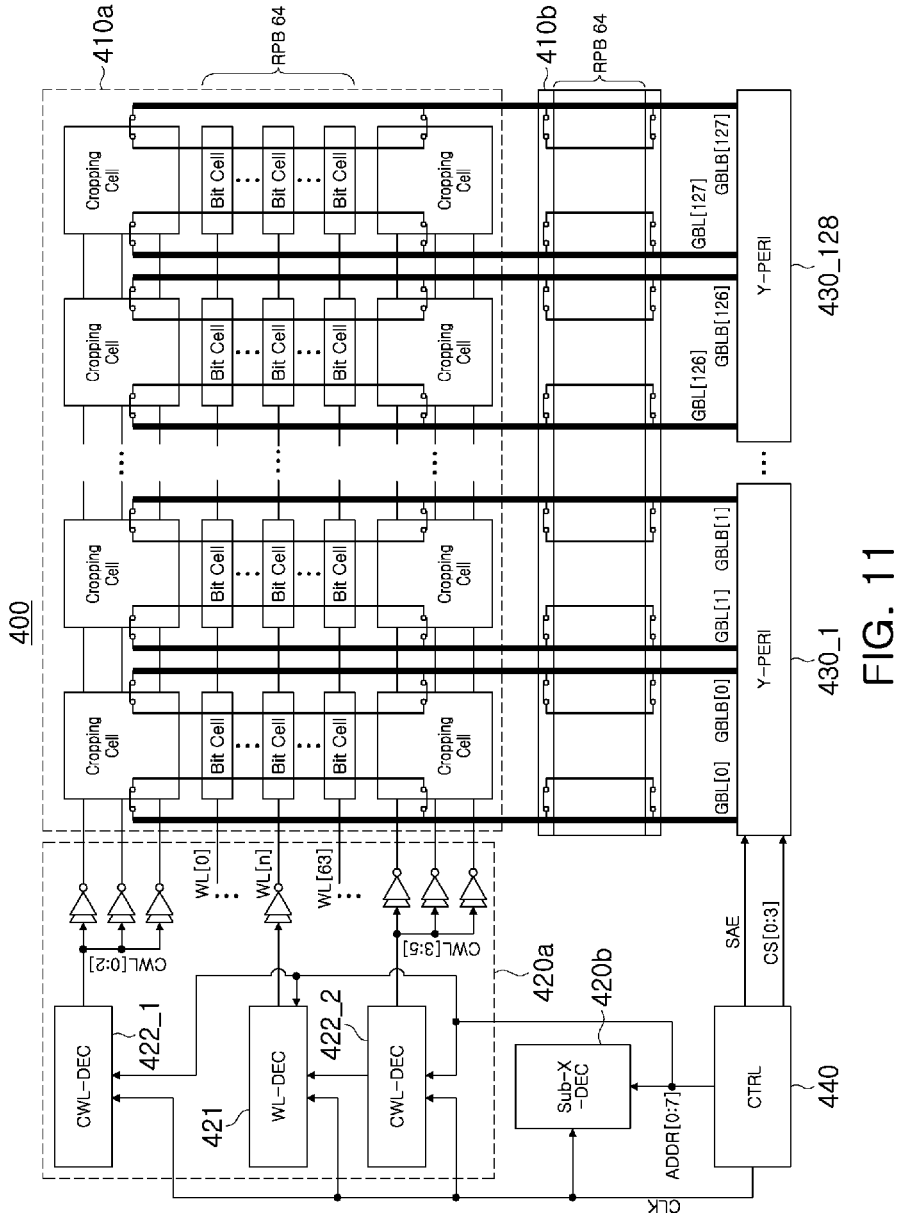
FIG. 11 is a diagram illustrating a macro structure of an embedded memory device according to an example embodiment of the present inventive concept.

FIG. 11 is a diagram illustrating a macro structure of an embedded memory device 400 according to an example embodiment of the present inventive concept. Referring to FIG. 11, the embedded memory device 400 may include subarrays 410a and 410b, sub-row decoders 420a and 420b, column peripheral circuits 430_1, . . . , and 430_128, and a control logic (CTRL) 440.

The sub-row decoder 420a may include a wordline decoder 421 and crop wordline decoders 422_1 and 422_2. The wordline decoder 421 may be implemented to activate a corresponding wordline in response to an address ADDR [0:7]. The crop wordline decoders 422_1 and 422_2 may be implemented to be connected to the corresponding cropping cell in response to a crop wordline signal CWL[0:5]. For example, the crop wordline signal CWL[0:5] is used to turn on/off cropping cells. The crop wordline signals CWL0 to CWL5 are identical to each other.

In an example embodiment, when a cropping cell is turned on, a local bitline BL formed of a lower metal member to which the selected bit cell is connected may be connected to the global bitline GBL formed of an upper metal member. The crop wordline signals CWL[0:5] for selecting the crop wordline CWL may be generated through an input signal of the sub-row decoder 420a. When a specific wordline is selected, the crop wordline CWL at a position corresponding thereto may be turned on. FIG. 11 illustrates a situation in which WL[n] is selected and CWL[0:5] is turned on.

When the write driver of the column peripheral circuit drives GBL[0] to 0 to perform a write operation (e.g., data 0), the global bitline GBL having relatively low resistance and capacitance may be discharged at high speed. Also, the local bitline BL connected to the global bitline GBL may be quickly discharged. A discharge rate of the local bitline BL of the present inventive concept is faster than a BL discharge rate of a conventional structure.

In the embedded memory device 400 of the present inventive concept, since a total resistance of the bitline is smaller than a total resistance of the bitline of the conventional structure, the bitline may be discharged closer to the ground voltage VSS. Therefore, the embedded memory device 400 of the present inventive concept may improve writing capability.

Figure 12:
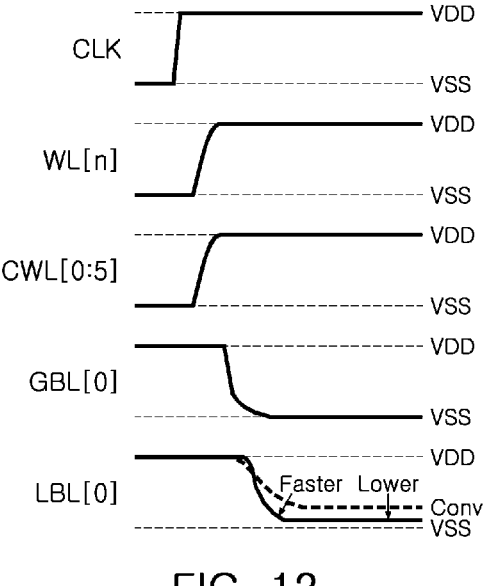
FIG. 12 is a timing diagram illustrating an operation timing of an embedded memory device according to an example embodiment of the present inventive concept.

FIG. 12 is a timing diagram illustrating a write operation (e.g., data 0) of the embedded memory device 400 according to an example embodiment of the present inventive concept. Referring to FIG. 12, the embedded memory device 400 may perform the write operation as follows.

A clock signal CLK has a high-level VDD. The wordline WL[n] selected by the address ADDR[0:7] (refer to FIG. 11) has a high-level VDD. The crop wordline signal CWL[0:5] has a high-level VDD. Accordingly, the global bitline GBL [0] is discharged to the low-level VSS. The local bitline LBL[0] connected to the global bitline GBL[0] is discharged to the low-level VSS. The bitline discharge rate of the present inventive concept may be higher than a conventional bitline discharge rate.

The embedded memory device according to an example embodiment of the present inventive concept may be inserted in a circuit requiring high density and uniformity, such as a memory cell, to reduce the effect of BL resistance even though interconnect resistance continuously increases according to technology scaling.

Figure 13:
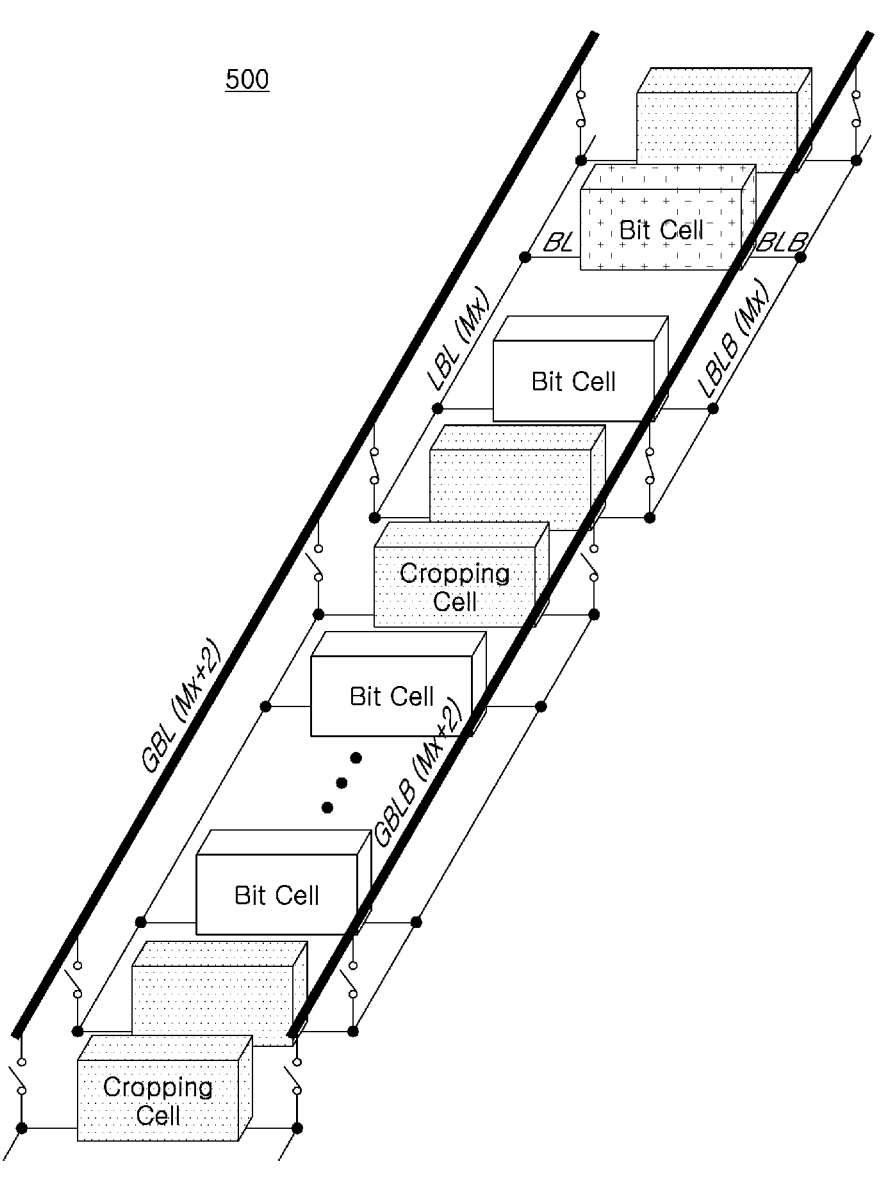
FIG. 13 is a diagram illustrating a crop bitline structure of an embedded memory device according to an example embodiment of the present inventive concept.

FIG. 13 is a diagram illustrating a crop bitline structure 500 of an embedded memory device according to an example embodiment of the present inventive concept. Referring to FIG. 13, a bit cell may be connected between a bitline BL and a complementary bitline BLB and a plurality of bit cells in a subarray may be connected between a local bitline LBL and a complementary local bitline LBLB formed of a lower metal member. The local bitline LBL may be electrically connected to a global bitline GBL formed of the upper metal member. The complementary local bitline LBLB may be electrically connected to a complementary global bitline GBLB formed of the upper metal member. A cropping cell is used to electrically connect the local bitline LBL to the global bitline GBL, and connect the complementary local bitline LBLB to the complementary global bitline GBLB. For example, when the local bitline LBL and the complementary local bitline LBLB are formed of a first metal (M1) the global bitline GBL and the complementary global bitline GBLB may be formed of a third metal (M3) above the first metal (M1).

Figure 14:
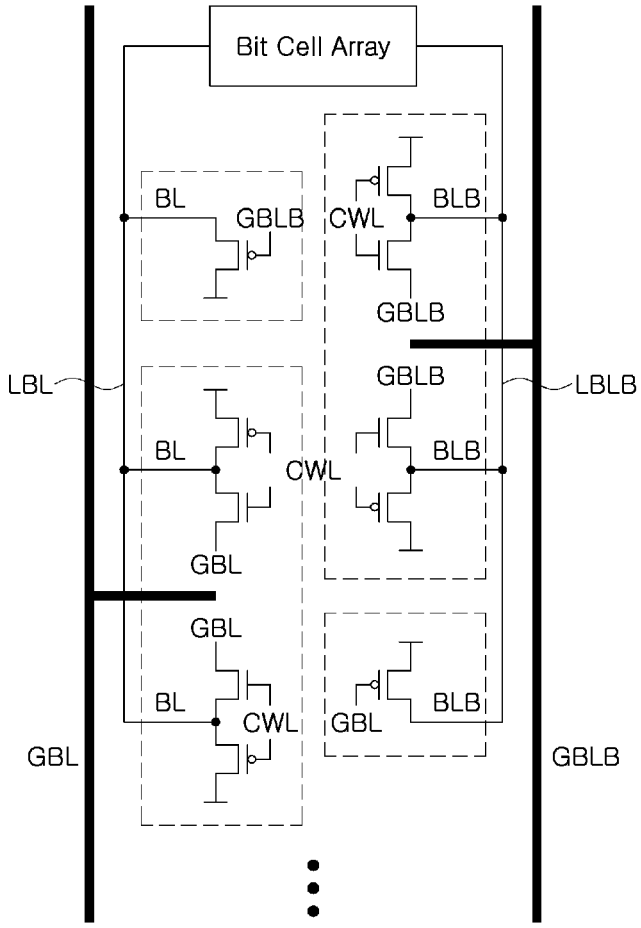
FIG. 14 is a diagram illustrating a cropping cell according to an example embodiment of the present inventive concept.

FIG. 14 is a diagram illustrating a cropping cell according to an example embodiment of the present inventive concept. Referring to FIG. 14, when the crop wordline CWL has a high-level, the bitline BL may be connected to the global bitline GBL. When each of the crop wordline CWL and the complementary global bitline GBLB has a low-level, the bitline BL may be pre-charged.

As illustrated in FIG. 14, the cropping cell includes: a first PMOS transistor connected between a power supply terminal VDD and a bitline BL and having a gate connected to a complementary global bitline GBLB; a second PMOS transistor connected between the power supply terminal VDD and the bitline BL and having a gate connected to a crop wordline CWL; a third PMOS transistor connected between the power supply terminal VDD and the bitline BL and having a gate connected to the crop wordline CWL; a fourth PMOS transistor connected between the power supply terminal VDD and a complementary bitline BLB and having a gate connected to a global bitline GBL; a fifth PMOS transistor connected between the power supply terminal VDD and the complementary bitline BLB and having a gate connected to the crop wordline CWL; a sixth PMOS transistor connected between the power supply terminal VDD and the complementary bitline BLB and having a gate connected to the crop wordline CWL; a first NMOS transistor connected between the global bitline GBL and the bitline BL and having a gate connected to the crop wordline CWL; a second NMOS transistor connected between the global bitline GBL and the bitline BL and having a gate connected to the crop wordline CWL; a third NMOS transistor connected between the complementary global bitline GBLB and the complementary bitline BLB and having a gate connected to the crop wordline CWL; and a fourth NMOS transistor connected between the complementary global bitline GBLB and the complementary bitline BLB and having a gate connected to the crop wordline CWL.

Meanwhile, the PMOS transistors present inside the cropping cell illustrated in FIG. 14 may be local pre-charge circuits for the local bitline LBL. In addition, the NMOS transistors present inside the cropping cell illustrated in FIG. 14 may serve as multiplexers (MUXs) connecting the global bitline GBL to the local bitline LBL.

Figure 15:
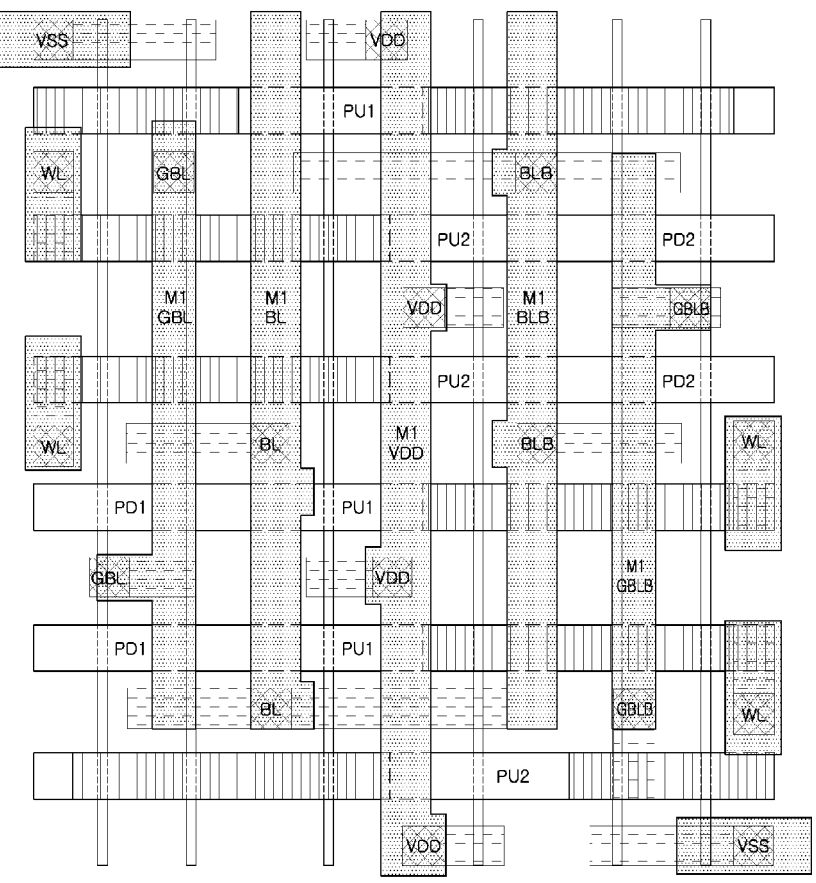
FIG. 15 is a diagram illustrating a layout of a cell array of an embedded memory device according to an example embodiment of the present inventive concept.

FIG. 15 is a diagram illustrating a layout of the cropping cell illustrated in FIG. 14. As illustrated in FIG. 15, polys not used in layout are cut with a cutting layer. A transistor not used in the existing SRAM cell is deleted. M1 metal for GBL/GBLB contact may be added. As described above, the layout of the cropping cell of the present inventive concept has a routing modification inside the cell to which M1 metal corresponding to GBL/GBLB is added, but the bitline BL, the wordline WL, and the ground voltage VSS line may be routed without white (or empty) space, without modifying an adjacent SRAM cell.

FIG. 16 is a diagram illustrating a position of a cropping cell according to an example embodiment of the present inventive concept. Cropping cells A and B may be located above and below a bit cell array. Patterns or structures formed each of the cropping cells A and B may be symmetric with respect to X-axis.

Figure 17:
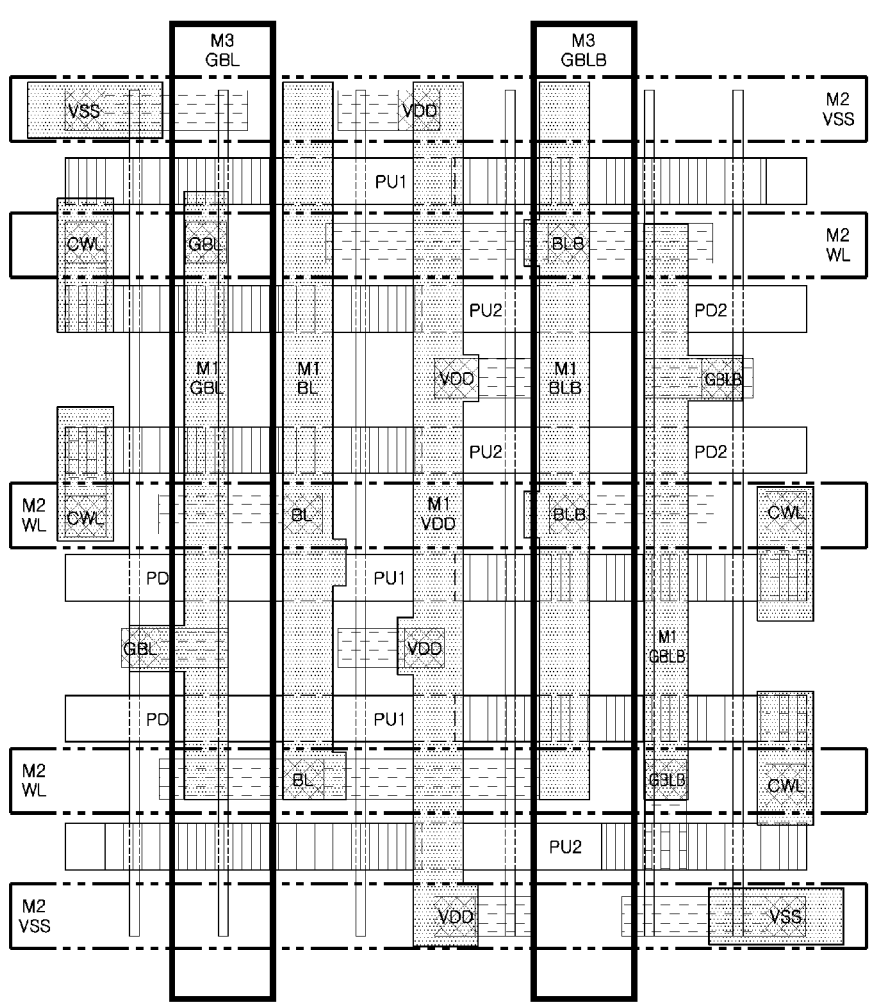
FIG. 17 is a diagram illustrating a layout of a cell array of an embedded memory device according to another example embodiment of the present inventive concept.

FIG. 17 is a diagram illustrating a layout of the cropping cell A illustrated in FIG. 16. As illustrated in FIG. 17, unnecessary VSS metal (M2 metal) may be deleted. Global bitlines GBL and GBLB may be formed using the upper metal member (M3 metal).

Figure 18:
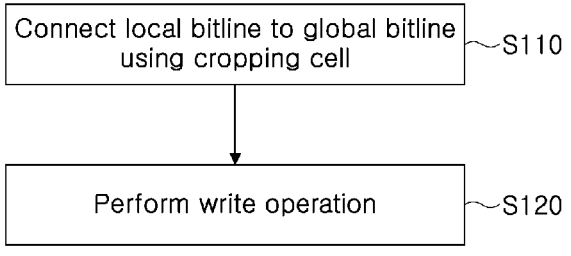
FIG. 18 is a flowchart illustrating an operation of an embedded memory device according to an example embodiment of the present inventive concept.

FIG. 18 is a flowchart illustrating an operation of an embedded memory device according to an example embodiment of the present inventive concept. Referring to FIGS. 1 to 6, 7A to 7C, 8A to 8C, 9A, 9B, 10A, 10B, and 11 to 18, the embedded memory device may perform a write operation as follows.

The local bitline LBL corresponding to the target bit cell may be connected to the global bitline GBL by using a cropping cell (S110). Thereafter, a write operation on the target bit cell may be performed by transmitting write data to the global bitline GBL (S120).

In an example embodiment, a wordline selected from among a plurality of wordlines may be set to a high-level in response to an address signal. In an example embodiment, during a write operation, a clock signal CLK may be set to a high-level, and a crop wordline signal CWL[0:5] may be output in response to the clock signal CLK. Here, the global bitline GBL and the local bitline LBL may be connected using at least one cropping cell in response to the crop wordline signal CWL[0:5]. In an example embodiment, when the crop wordline signal CWL[0:5] has a high-level, the local bitline LBL may be connected to the global bitline GBL. In an example embodiment, when the crop wordline signal CWL[0:5] has a low-level, the local bitline LBL may be pre-charged to a high-level.

Figure 19:
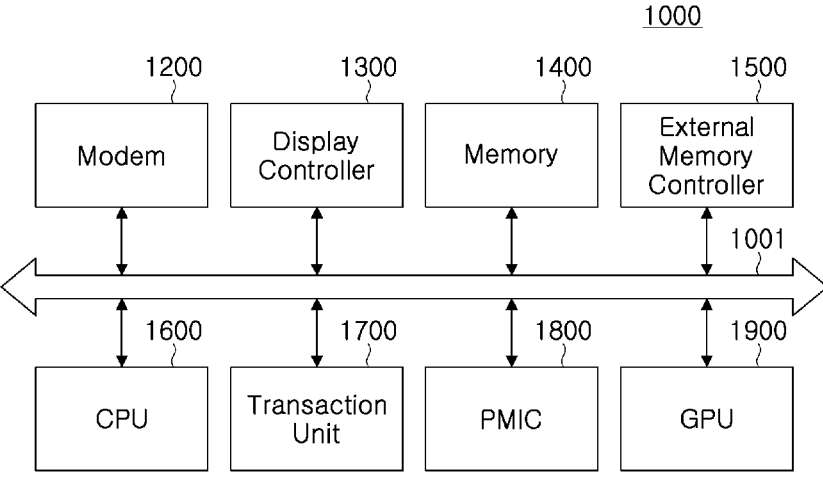
FIG. 19 is a diagram illustrating a system-on-chip (SOC) according to an example embodiment of the present inventive concept.

FIG. 19 is a diagram illustrating a system-on-chip (SOC) according to an example embodiment of the present inventive concept. An SOC 1000 is obtained by implementing complex functional blocks, such as intellectual property (IP) performing various functions in a single chip, and bit cells arranged according to example embodiments of the present inventive concept may be included in each functional block of the SOC 1000. Referring to FIG. 19, the SOC 1000 may include a modem 1200, a display controller 1300, a memory device 1400, an external memory controller 1500, a central processing unit (CPU) 1600, a transaction unit 1700, a PMIC 1800, and a graphics processing unit (GPU) 1900, and respective functional blocks of the SOC 1000 may communicate with each other through a system bus 1001. The CPU 1600 capable of overall controlling the operation of the SOC 1000 may control the operations of the other functional blocks 1200, 1300, 1400, 1500, 1700, 1800, and 1900.

The modem 1200 may demodulate a signal received from the outside of the SOC 1000 or modulate a signal generated inside the SOC 1000 and transmit the signal externally. The display controller 1300 may transmit data generated inside the SOC 1000 to a display by controlling the display (or a display device) outside the SOC 1000.

The memory device 1400 may include a non-volatile memory, such as an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc. and may include a volatile memory, such as a dynamic random access memory (DRAM), a static random access memory (SRAM), a mobile DRAM, a double data rate synchronous dynamic random access memory (DDR SDRAM), a low power DDR (LPDDR) SDRAM, a graphic DDR (GDDR) SDRAM, a Rambus dynamic random access memory (RDRAM), etc. As described with reference to FIGS. 1 to 6, 7A to 7C, 8A to 8C, 9A, 9B, 10A, 10B, and 11 to 17, the memory device 1400 may be implemented as an embedded memory device having a CBL structure.

The external memory controller 1500 may control an operation of transmitting and receiving data to and from an external integrated circuit connected to the SOC 1000. For example, programs or data stored in an external integrated circuit may be provided to the CPU 1600 or the GPU 1900 under the control of the external memory controller 1500.

The transaction unit 1700 may monitor data transactions of each functional block, and the PMIC 1800 may control power supplied to each functional block under the control of the transaction unit 1700.

The GPU 1900 may execute program instructions related to graphic processing. The GPU 1900 may receive graphic data through the external memory controller 1500 or transmit graphic data processed by the GPU 1900 to the outside of the SOC 1000 through the external memory controller 1500.

The devices described herein may be implemented using hardware components, software components, or a combination thereof. For example, the hardware components may include microphones, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The crop bitline structure according to an embodiment of the present invention has a resistance that is slightly larger than a DBL and smaller than an FBL in situations where the resistance is relatively small, and may improve the magnitude of resistance compared to the DBL structure in situations where total resistance increases (increase in capacitance, increase in BL resistance per cell). The cropped bitline structure according to an example embodiment of the present inventive concept has a write ability yield significantly improved compared to the conventional structure or the FBL and shows an overall improvement in write ability yield similar to that of the DBL. The crop bitline structure according to an embodiment of the present invention may effectively reduce capacitance of the entire BL by using the characteristics of the upper metal member with small capacitance. In addition, the crop bitline structure according to an example embodiment of the present inventive concept may reach ideal yield at a faster rate than compared structures.

The embedded memory device and the operating method thereof according to example embodiments of the present inventive concept may reduce interconnect resistance and capacitance by using the crop bitline structure.

The embedded memory device and the operating method thereof according to an example embodiment of the present inventive concept may improve write performance and simultaneously reduce power consumption by the crop bitline structure.

While example embodiments have been illustrated and described above, it will be apparent to those skilled in the art that modifications and variations could be made without departing from the scope of the present invention as defined by the appended claims.

What is claimed is:

1. An embedded memory device comprising:
a plurality of first bit cells configured to store data and connected between a first bitline and a first complementary bitline; and
at least one first cropping cell connected between the first bitline and the first complementary bitline, the at least one first cropping cell configured to electrically connect a global bitline to the first bitline and electrically connect a complementary global bitline to the first complementary bitline in response to a first crop wordline signal,
wherein the global bitline and the complementary global bitline are implemented as an upper metal member,
wherein the first bitline and the first complementary bitline are implemented as a lower metal member disposed below the upper metal member,
wherein, in a write operation of the embedded memory device, the embedded memory device is configured such that the at least one first cropping cell electrically connects the global bitline to the first bitline and electrically connects the complementary global bitline to the first complementary bitline in response to the first crop wordline signal having a first level, and
wherein, in a pre-charge operation of the embedded memory device, the embedded memory device is configured such that the at least one first cropping cell pre-charges the first bitline and the first complementary bitline in response to the first crop wordline signal having a second level opposite to the first level.

2. The embedded memory device of claim 1, wherein the plurality of first bit cells and the at least one first cropping cell are disposed inside a cell array of the embedded memory device.

3. The embedded memory device of claim 1, wherein the at least one first cropping cell includes:
an NMOS MUX configured to electrically connect the global bitline to the first bitline and electrically connect the complementary global bitline to the first complementary bitline based on the first crop wordline signal having the first level of a high-level.

4. The embedded memory device of claim 1, wherein the at least one first cropping cell includes:
a local pre-charger configured to pre-charge the first bitline and the first complementary bitline based on the first crop wordline signal having the second level of a low-level.

5. The embedded memory device of claim 1, wherein the at least one first cropping cell includes:
a cross-coupled PMOS switch configured to receive data from the global bitline and the complementary global bitline and maintain a voltage of the first bitline or the first complementary bitline based on the received data.

6. The embedded memory device of claim 1, wherein, in a read operation of the embedded memory device, the embedded memory device is configured such that a charge of the global bitline is discharged to a selected bit cell through the first bitline.

7. The embedded memory device of claim 1, wherein, in the write operation of the embedded memory device, the embedded memory device is configured such that the first complementary bitline is discharged to a ground voltage.

8. The embedded memory device of claim 1, further comprising:
a plurality of second bit cells connected between a second bitline and a second complementary bitline; and
at least one second cropping cell connected between the second bitline and the second complementary bitline,
wherein the at least one second cropping cell is configured to electrically connect the global bitline to the second bitline and electrically connect the complementary global bitline to the second complementary bitline in response to a second crop wordline signal.

9. The embedded memory device of claim 1, wherein the at least one first cropping cell is implemented with the same poly, fin pitch, or pattern as a portion of the plurality of first bit cells.

10. The embedded memory device of claim 1, wherein the at least one first cropping cell is implemented with the same metal routing pattern as a portion of adjacent bit cells among the plurality of first bit cells.

11. An embedded memory device comprising:
a plurality of subarrays sharing a plurality of global bitlines and a plurality of complementary global bitlines; and
a column peripheral circuit connected to the plurality of global bitlines and the plurality of complementary global bitlines,
wherein each of the plurality of subarrays includes:
a plurality of first cropping cells connected to a first crop wordline;
a plurality of second cropping cells connected to a second crop wordline; and
a plurality of bit cells configured to store data and connected to a plurality of bitlines, to a plurality of complementary bitlines, and to a plurality of wordlines,
wherein, in a write operation on selected bit cells connected to a wordline among the plurality of wordlines, the embedded memory device is configured such that each of the plurality of first cropping cells and the plurality of second cropping cells electrically connects corresponding bitlines of the plurality of bitlines to corresponding global bitlines of the plurality of global bitlines corresponding to the selected bit cells and electrically connects corresponding complementary bitlines of the plurality of complementary bitlines to corresponding complementary global bitlines of the plurality of complementary global bitlines corresponding to the selected bit cells,
wherein the plurality of global bitlines and the plurality of complementary global bitlines are implemented as an upper metal member,
wherein the plurality of bitlines and the plurality of complementary bitlines are implemented as a lower metal member disposed below the upper metal member,
wherein each of the plurality of first cropping cells has the same structure as each of the plurality of second cropping cells, and
wherein, after the write operation on the selected bit cells, the embedded memory device is configured such that each of the plurality of first cropping cells and the plurality of second cropping cells maintains voltages of the corresponding bitlines based on data from the corresponding complementary global bitlines or voltages of the corresponding complementary bitlines based on data from the corresponding global bitlines.

12. The embedded memory device of claim 11, wherein each of the plurality of first cropping cells and the plurality of second cropping cells includes:

an NMOS MUX configured to electrically connect a corresponding global bitline to a corresponding bitline and electrically connect a corresponding complementary global bitline to a corresponding complementary bitline based on signals of the first and second crop wordlines each having a high-level;

a local pre-charger configured to pre-charge the corresponding bitline and the corresponding complementary bitline based on the signals of the first and second crop wordlines each having a low-level; and a cross-coupled PMOS switch configured to receive data from the corresponding global bitline and the corresponding complementary global bitline and maintain a voltage of the corresponding bitline or the corresponding complementary bitline based on the received data.

13. The embedded memory device of claim 11, further comprising:

a wordline decoder configured to select one of the plurality of wordlines in response to an address; and a crop wordline decoder configured to activate the first crop wordline and the second crop wordline in response to a clock.

14. The embedded memory device of claim 11, wherein each of the plurality of first cropping cells and the plurality of second cropping cells is implemented with the same poly, fin pitch, or pattern as a portion of the plurality of bit cells, and implemented with the same metal routing pattern as a portion of adjacent bit cells among the plurality of bit cells.

15. The embedded memory device of claim 11, wherein:

in a read operation of the embedded memory device, the embedded memory device is configured such that a charge of a corresponding global bitline is discharged to a selected bit cell through a corresponding bitline, and in the write operation, the embedded memory device is configured such that a complementary bitline corresponding to the selected bit cell is discharged to a ground voltage.

16. An operating method of an embedded memory device including a plurality of bit cells connected between a local bitline and a complementary local bitline, the operating method comprising:

electrically connecting the local bitline to a global bitline, and connecting the complementary local bitline to a complementary global bitline using at least one cropping cell connected to a crop wordline;

performing a write operation of the embedded memory device on a selected bit cell connected to the local bitline; by applying a crop wordline signal having a high-level to the crop wordline; and after performing the write operation of the embedded memory device maintaining a voltage of the local bitline by receiving data from the complementary global bitline or a voltage of the complementary local bitline by receiving data from the global bitline, wherein the global bitline is implemented as an upper metal member, and wherein the local bitline is implemented as a lower metal member disposed below the upper metal member.

17. The operating method of claim 16, wherein the performing of the write operation on the selected bit cell includes:

selecting a wordline connected to the selected bit cell among a plurality of wordlines by applying a high-level.

18. The operating method of claim 16, wherein the performing of the write operation on the selected bit cell includes setting a clock signal to a high-level during the write operation, and wherein the electrically connecting of the local bitline and the global bitline includes providing a crop wordline signal to the at least one cropping cell by setting the clock signal.

19. The operating method of claim 18, wherein the electrically connecting of the local bitline and the global bitline is performed when the crop wordline signal is at a high-level.

20. The operating method of claim 18, further comprising:

pre-charging the local bitline when the crop wordline signal is at a low-level.

* * * * *